(12) United States Patent
Radhakrishnan

(10) Patent No.: US 7,241,475 B2
(45) Date of Patent: Jul. 10, 2007

(54) METHOD FOR PRODUCING CARBON SURFACE FILMS BY PLASMA EXPOSURE OF A CARBIDE COMPOUND

(75) Inventor: Gouri Radhakrishnan, Rancho Palos Verdes, CA (US)

(73) Assignee: The Aerospace Corporation, El Segundo, CA (US)

( * ) Notice: Subject to any disclaimer, the term of this patent is extended or adjusted under 35 U.S.C. 154(b) by 0 days.

(21) Appl. No.: 10/954,455

(22) Filed: Sep. 30, 2004

(65) Prior Publication Data
US 2006/0068125 A1 Mar. 30, 2006

(51) Int. Cl.
C23C 16/02 (2006.01)
C23C 16/32 (2006.01)
H05H 1/24 (2006.01)

(52) U.S. Cl. ............. 427/249.8; 427/569; 427/249.1
(58) Field of Classification Search ............. 427/249.1, 427/249.6, 249.8, 569
See application file for complete search history.

(56) References Cited

U.S. PATENT DOCUMENTS 5,002,631 A * 3/1991 Giapis et al. ............ 216/60
5,788,799 A * 8/1998 Steger et al. ............ 156/345.37
6,579,833 B1 * 6/2003 McNallan et al. ............ 508/100

FOREIGN PATENT DOCUMENTS

JP 01223733 A * 9/1989
JP 02080300 A * 3/1990

OTHER PUBLICATIONS

Pierson, H. "Handbook of Chemical Vapor Deposition" 1992, Noyes Publications, p. 98.*

* cited by examiner

Primary Examiner—William Phillip Fletcher, III
Assistant Examiner—Cachet I. Sellman
(74) Attorney, Agent, or Firm—Derrick Michael Reid

(57) ABSTRACT

Reactive halogen-ion plasmas, having for example, generating chloride ions, generated from low-pressure halogen gases using a radio-frequency plasma are employed for producing low-friction carbon coatings, such as a pure carbon film, at or near room temperature on a bulk or thin film of a compound, such as titanium carbide.

12 Claims, 1 Drawing Sheet

PROCESS OF FORMING A RESULTANT FILM

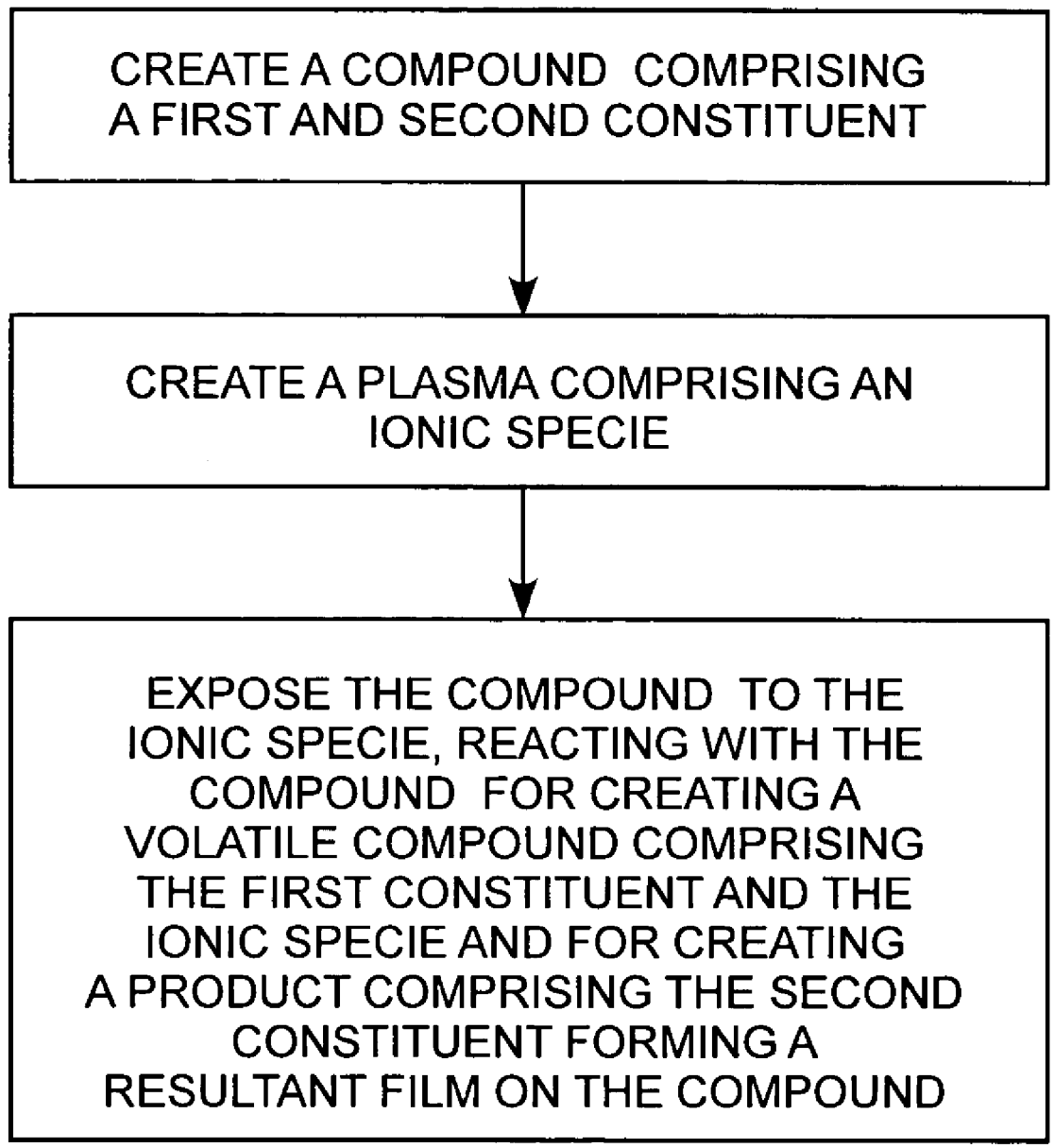
PROCESS OF FORMING A RESULTANT FILM

METHOD FOR PRODUCING CARBON SURFACE FILMS BY PLASMA EXPOSURE OF A CARBIDE COMPOUND

FIELD OF THE INVENTION

The invention relates to the field of semiconductor processing methods. More particularly, the present invention relates to the creation of pure film from a compound by surface constituent depletion through extraction using plasma exposure.

BACKGROUND OF THE INVENTION

A new class of carbon materials with useful properties has been produced by chlorination of metal carbides. When reacting with metal carbides, such as silicon carbide SiC or titanium carbide TiC, chlorine forms stable volatile compounds with metals but does not react with carbon at high temperatures. The remaining carbon rearranges itself into a structure, as a pure surface film, which is a derivative of the original ceramic compound. Using this technology, carbon coatings with low friction coefficients and high hardness have been produced from bulk SiC and TiC. In previously reported methods, the production of the low-friction carbon films involves high-temperature chlorination, such as between 1073–1273 K, of the carbide. The carbon coatings have low friction coefficients and high hardness produced from bulk SiC and TiC using high-temperature chlorination of the carbide. There are practical difficulties encountered when protecting silicon from attack by chloride radicals used in various processes. Hence, silicon has to be protected with a mask. Standard masking materials are unable to withstand the high temperatures and significantly long times used for the high-T chlorination process.

The production of a thin layer of low-friction carbon at a specific location of a device that is susceptible to high wear and damage due to frequent sliding contact would be highly desirable. Moving microelectromechanical systems (MEMS) devices are ideal candidates for the application of such coatings as MEMS are known to degrade due to wear and friction on contacting surfaces. Titanium carbide has been one of the preferred coatings for improving the performance of macroscopic moving mechanical components due to the inherent established wear resistance. These TiC coatings have been applied to critical interfaces of a MEMS micromotor and directly integrated into the device fabrication scheme. However, in addition to being able to deposit TiC at sliding interfaces, the proper lubrication of TiC versus a second TiC interface is very important. The conversion of a thin layer, between 50 nm and 1000 nm, of TiC to low-friction carbon may substantially improve the performance of a moving MEMS device by providing both wear-resistant and low-friction interfaces.

The previously reported processes for the production of the low-friction carbon films from SiC, involves high-temperature chlorination of SiC, on the order of 1000° C., in a 3.5% $Cl_2$ chlorine with Ar-96.5% gas. However, critical problems exist when applying this process to the fabrication of micro devices. Such devices are typically produced on a silicon substrate, which itself is susceptible to attack by Cl or F radicals and must be protected from the halogenation process. Standard photolithographic mask materials are not capable of withstanding the high temperatures employed in the chlorination process. For these reasons, an alternative low-temperature process for the generation of low-friction carbon films from hard carbides is highly desirable. These and other disadvantages are solved or reduced using the invention.

SUMMARY OF THE INVENTION

An object of the invention is to provide a method for producing a surface film from a compound using plasma exposure where one constituent of the compound is extracted from the compound.

Another object of the invention is to provide a method for producing a surface film from a compound of metal using exposure to a plasma comprising a reactive halogen ion where the metal constituent of the compound is extracted from the compound leaving a pure surface film.

Yet a further object of the invention is to provide a method for producing a surface film of carbon from a compound of titanium carbide using exposure of the titanium carbide to a plasma comprising a reactive chloride ion where the titanium metal constituent of the compound is extracted when reacting with the chloride ion, leaving a pure surface carbon film.

Still a further object of the invention is to provide a method for producing a surface film of carbon from a compound of titanium carbide using exposure to a plasma comprising a reactive chloride ion where the titanium metal constituent of the compound is extracted when combined with the chloride ion, from the titanium carbide compound leaving a pure surface carbon film at any temperature at or above room temperature.

The present invention is directed to a method of producing a pure surface film from a metal compound by halogen ion exposure of the compound where the metal constituent is extracted off the compound when combined with the halogen ion resulting in a pure surface film remainder of a second constituent of the compound. In the preferred form, the halogen ion is chloride, the compound is titanium carbide, and the remainder surface film is carbon. The carbon surface film offers a low friction surface suitable for MEMS applications. The method will allow use of standard mask materials for application to MEMS and other patterned microdevices. The use of lower temperatures also allows for thinner carbon layers to be formed with better control.

The method can be used at room temperature. A reactive halogen-ion plasma is generated from low-pressure halogen gases, such as chlorine or fluorine, using a radio-frequency source. The method can be used for producing low-friction carbon coatings at or near room temperature on bulk or thin films of titanium chloride TiC compound. Formation of low-friction, carbide-derived carbon surface film on bulk TiC by low-temperature RF plasma reactions in $Cl_2$ can be verified by Raman spectroscopy and pin-on-disk friction tests. The method preferably uses reactive ion halogen plasmas, generated from low-pressure halogen gases using a radio-frequency source for producing low-friction carbon coatings at or near room temperature on bulk carbides. The method preferably enables the formation of carbide-derived carbon on TiC by low-temperature RF plasma reactions in $Cl_2$ that can be verified by Raman spectroscopy. Raman spectra on RF-plasma treated TiC show disappearance of the TiC bands and appearance of the characteristic carbon D and G bands similar to spectra produced when TiC is treated in $Cl_2$ gas at 1073 K. In pin-on-disk tests performed in ambient air (8% R.H.), the coefficient of friction of the plasma treated TiC is as low, <0.2, as that of TiC treated at high temperature in high-pressure chlorine. These demonstrate that plasma processing is a viable way to produce carbide-derived carbon on carbide ceramics without exposure to the elevated temperatures.

The method has several advantages. Large areas can be easily treated by the method. The method is easy to implement. The method uses low-pressure chlorine in very small quantities, and hence, is easy to apply in industrial labs, and readily conforms to safety regulations involving the use of chlorine. The method is very generic and can be applied to any bulk or thin-film metal carbide. The method can be applied to processing of microscale devices, such as MEMS devices, typically fabricated on silicon substrates and requiring photolithographic patterning. These and other advantages will become more apparent from the following detailed description of the preferred embodiment.

BRIEF DESCRIPTION OF THE DRAWING

The drawing is a process flow diagram for creating a pure film from a compound using plasma exposure.

DETAILED DESCRIPTION OF THE PREFERRED EMBODIMENT

An embodiment of the invention is described with reference to the drawing. The method comprises three essential steps including creating a compound comprising a first and second constituent, creating a plasma comprising an ionic specie, and exposing the compound to the ionic specie that reacts with the compound for creating a volatile compound comprising the first constituent and the ionic specie and for creating a product comprising the second constituent forming a resultant film on the compound. In the preferred form, the compound in titanium carbide (TiC), the ionic species with chloride Cl⁻, the volatile compound with titanium tetrachloride ($TiCl_4$) and the resultant film is a surface film of carbon (C). The compound can be either bulk or thin film material.

The form of the method is generic and can be applied to any metal carbide, such as TiC, SiC, WC, TaC, ZrC, VC, HfC, Nbc, $SeC_2$, $MO_2C$. Commercially available TiC sputter targets (such as from ESPI) can be employed. Experiments can be performed in a reactive-ion etching (RIE) system, such as March Instruments Inc., CS-1701 that uses a radio-frequency (RF) source to produce a halogen plasma. The RF power in this March system can be varied from 0–600 W. The March system is equipped with a variety of gases that are controlled by mass flow controllers. Gas pressures are in the mtorr range and both the flow rate and gas pressure can be controlled. The gases include $Cl_2$, $SF_6$, $CF_4$, $BCl_3$, Ar, and $O_2$ gases. An advantage of such a system is that low gas pressures are employed in the mtorr range, and the system is operated at or near room temperature that allows standard photoresist to be used for patterning device structures. For results described here, $Cl_2$ gas was used at a pressure of 85 mtorr, regulated by a mass flow controller set at 15 sccm. The RF power was 300 W. The sample stage was maintained at 40 C using a temperature-control feedback loop. Bulk TiC samples were exposed to 15, 30, and 60 minutes of $Cl_2$ plasma and then analyzed using Raman spectroscopy. Raman spectra can be recorded, for example using a Renishaw 2000 spectrometer, equipped with a micro-Raman Spectrometer Renishaw Ramascope 2000 fitted with a 50×, 0.65NA objective and a Peltier-cooled CCD array, using the 514.5 nm line of an air-cooled Argon ion laser limited to 30 mW power or using a HY Horiba U1000 Research Raman Instrument with a double monochromator, a Raman microscope, and both CCD and PMT detection that uses a Coherent Argon Ion laser at 514.5 nm and 488 nm, with 200 mW max power. A holographic notch filter can be used to filter out the Rayleigh radiation. Spectra were recorded with Raman spectra of TiC samples were measured in the range 200–2000/cm. Characteristic peaks at 412.5/cm and 607.1/cm were observed with untreated TiC. With increasing exposure to $Cl_2$ plasma, the TiC peaks decrease in intensity and eventually disappear completely, while a peak at 1588.8/cm is observed, as well as a small shoulder at 1336.4/cm. The Raman spectra are consistent with the formation of a continuous carbon layer on the TiC surface that shields the underlying material from the laser. The new peaks, which appear, are consistent with the D and G bands of carbon and characteristic of a carbide derived carbon coating. Based on these Raman spectra, the treated specimens are subjects for tribological testing.

The tribological characteristics of the plasma synthesized carbon films may be investigated using pin-on-disk testing in ambient air using a commercially available tribometer such as the CSEM tribometer or the TRB system from CSEM/Micro-Photonics. Pin on disk tests were performed using 9.525 mm diameter $Si_3N_4$ ball sliding against treated or untreated TiC. The tests were performed in open laboratory air at 8% relative humidity and 25° C. The normal force on the ball was 2N, the sliding velocity was 2.67 cm/s, and the wear track was 16 mm in diameter. Tests were continued for approximately 10 minutes or 16 m sliding distance.

The coefficient of friction for high-temperature treated TiC and for room-temperature plasma treated TiC can be determined. Pin-on disk data for a disk cut from an untreated TiC target and a TiC target treated at 800 C in 3.5% $Cl_2$–96.5% Ar gas can be generated. This data suggest that while the coefficient of friction (COF) for the untreated TiC disk is initially low, possibly due to a native oxide, which is lubricious under the test conditions, it rises to the range of 0.6 or so within a short time. The friction coefficient with the treated disk remains low over the entire test period, covering approximately 20 meters of sliding. This behavior is similar to the performance of carbide derived carbon coated SiC specimens reported earlier, and represents a substantial improvement in tribological performance over the untreated TiC. These results also indicate that carbide derived carbon with similar properties can be obtained by chlorination treatments of different metal carbides, and suggests that any hard carbide material may be a suitable substrate for carbide derived carbon processing.

Pin-on-disk data from a TiC sample that was subjected to 60 minutes of $Cl_2$ plasma can be used as performance indicators. In particular, the COF can be plotted versus time rather than distance traveled. As was the case for the TiC subjected to high temperature treatment, the COF of the treated TiC remains below 0.2 for the duration of the test, demonstrating a substantial improvement in tribological behavior. Although the carbide derived carbon layer produced by the plasma treatment is thinner than that produced by the high temperature treatment, the performance is similar and shows that such treatments can be used to improve tribological performance in moving MEMS devices.

The method can be applied to coatings for MEMS devices, in various applications, including the automotive industry, electronics, and thermal CVD coatings in medical implements. The present invention is directed to forming a surface layer from a compound using reactive ions. In the preferred invention metal carbides are exposed to halogen ions for creating a resultant surface layer on the compound. In the preferred form, TiC compound, Cl⁻ halogen ion, are used for creating a resultant carbon film, though other halogen and metal compounds can be used. Those skilled in the art can make enhancements, improvements, and modifications to the invention, and these enhancements, improvements, and modifications may nonetheless fall within the spirit and scope of the following claims.

What is claimed is:

1. A method for creating a resultant surface film comprising a second constituent in a compound comprising a first constituent and the second constituent, the method comprising steps of, creating the compound comprising the first and second constituents, the second constituent is an elemental constituent for forming the resultant surface film, creating a plasma comprising an ionic specie, and exposing the compound to the ionic specie that reacts with the first constituent of the compound for creating a volatile product comprising the first constituent and the ionic specie and for creating a product comprising the second constituent forming the resultant surface film on a remainder of the compound, the resulting surface film is a pure film of the second constituent, wherein, the ionic specie is a halogen specie, the compound is a metal carbide, the first constituent is an elemental metal, the second constituent is carbon, and the pure film is a carbon pure film.

2. The method of claim 1 wherein, the ionic specie is a chloride.

3. The method of claim 1 wherein, the exposing step is conducted at room temperature.

4. The method of claim 1 wherein, the compound is a carbide selected from the group consisting of TiC, SiC, WC, TaC, ZrC, VC, HfC, NbC, $SeC_2$, and $Mo_2C$.

5. The method of claim 1 wherein, the exposing step is a plasma exposing step.

6. The method of claim 1 wherein, the ionic specie is a halogen selected from the group consisting of Cl, F, and Br.

7. The method of claim 1 wherein, the first constituent is an elemental constituent of Ti.

8. The method of claim 1 wherein, the exposing step is processed at 85 mtorr.

9. A method for creating a resultant surface film comprising a second constituent in a compound comprising a first constituent and the second constituent, the method comprising steps of, creating the compound comprising the first and second constituents, the first and second constituents are first and second elemental constituents, the second constituent is an elemental constituent for forming the resultant surface film, the second constituent and the resultant surface film are pure carbon, creating a plasma comprising an ionic specie, and exposing the compound to the ionic specie that reacts with the first constituent of the compound for creating a volatile product comprising the first constituent and the ionic specie and for creating a product comprising the second constituent forming a resultant surface film on a remainder of the compound, wherein, the ionic specie is a halogen specie, the compound is a metal carbide, the first constituent is an elemental metal, the second constituent is carbon, and the resultant surface film is a pure carbon film.

10. The method of claim 9 wherein, the ionic specie is ionic chloride, and the first elemental constituent is titanium.

11. The method of claim 9 wherein, the exposing step is processed at 85 mtorr.

12. The method of claim 9 wherein, the exposing step is processed at 40° C.

* * * * *